United States Patent
Pai et al.

(10) Patent No.: US 9,449,712 B2
(45) Date of Patent: Sep. 20, 2016

(54) SHIFT REGISTER WITH HIGHER DRIVING VOLTAGE OF OUTPUT STAGE TRANSISTOR AND FLAT PANEL DISPLAY USING THE SAME

(71) Applicant: AU Optronics Corp., Hsin-Chu (TW)

(72) Inventors: Cheng-Chiu Pai, Hsin-Chu (TW); Ming-Hung Chuang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 55 days.

(21) Appl. No.: 14/486,100

(22) Filed: Sep. 15, 2014

(65) Prior Publication Data
US 2016/0019976 A1 Jan. 21, 2016

(30) Foreign Application Priority Data
Jul. 21, 2014 (TW) .............................. 103124946 A

(51) Int. Cl.
*G11C 19/28* (2006.01)
*G09G 5/00* (2006.01)
*G09G 3/32* (2016.01)
*G09G 3/36* (2006.01)

(52) U.S. Cl.
CPC ............. *G11C 19/28* (2013.01); *G09G 3/3266* (2013.01); *G09G 3/3674* (2013.01); *G09G 2310/0267* (2013.01); *G09G 2310/0286* (2013.01)

(58) Field of Classification Search
CPC ................. G11C 19/28; G09G 5/003; G09G 2310/0286
See application file for complete search history.

(56) References Cited

U.S. PATENT DOCUMENTS

| | | | |
|---|---|---|---|
| 7,872,628 B2 * | 1/2011 | Cho | G09G 3/3677 345/100 |
| 8,537,963 B2 | 9/2013 | Chen et al. | |
| 2008/0095297 A1 * | 4/2008 | Jang | G09G 3/3677 377/81 |

* cited by examiner

*Primary Examiner* — Kwang-Su Yang
(74) *Attorney, Agent, or Firm* — WPAT, PC; Justin King

(57) ABSTRACT

A shift register and flat panel display using the same is provided therein. The shift register receives an operating voltage level. Through the circuit provided by the shift register, a driving voltage of an output-stage transistor is higher than prior art. Thus, the shift register has an enhanced driving ability.

15 Claims, 14 Drawing Sheets

SHIFT REGISTER WITH HIGHER DRIVING VOLTAGE OF OUTPUT STAGE TRANSISTOR AND FLAT PANEL DISPLAY USING THE SAME

TECHNICAL FIELD

The present disclosure relates to a shift register and a flat panel display using the same, and more particularly to a shift register having enhanced driving ability and a flat panel display using the same.

BACKGROUND

Referring to FIG. 1, which is a circuit view of a part of a conventional shift register. As shown, the gate terminal of the N-type transistor 100 receives the output signal $S_{N-1}$ outputted from the previous-stage shift register and the start signal ST is transmitted to the node $A_1$ through the turned-on N-type transistor 100. However, because both of the output signal $S_{N-1}$ and the start signal ST have voltage levels roughly equal to the high operating voltage level VGH, the voltage level of the node $A_1$ may be smaller than the original voltage level of the start signal ST after the start signal ST is transmitted to the node $A_1$ through the N-type transistor 100; wherein the voltage level of the node $A_1$ is obtained by subtracting the threshold voltage $V_{th}$ of the N-type transistor 100 from the high operating voltage level VGH.

Because the node $A_1$ has a voltage level value about VGH-$V_{th}$ and the gate terminal of the N-type transistor 110 is fixed to the high operating voltage level VGH, the node $A_2$ has a voltage level value about VGH-$V_{th}$ as same as the node $A_1$ has. Thus, when the voltage level of the clock signal CLK is transmitted, through the turned-on N-type transistor 120, to an output node for generating the output signal $S_N$, the voltage level of the output signal $S_N$ may be restricted due to that the voltage level of the node $A_2$ is smaller than the high operating voltage level VGH; and consequentially, the driving ability of the output signal $S_N$ is affected.

In addition, another issue may occur when a flat panel display uses the shift register of FIG. 1 to drive gate lines. Please referring to FIGS. 2A and 2B; wherein FIG. 2A is a circuit block view of a conventional flat panel display and FIG. 2B is a timing chart of the related signals used for driving the conventional flat panel display of FIG. 2A. As shown in FIG. 2A, the shift registers SR(1), SR(2), SR(3) and SR(4) are sequentially and alternatively arranged on two sides of the flat panel display and each is configured to drive a respective gate line. In addition, as shown in FIG. 2B, the output signal $S_1$, $S_2$, $S_3$ and $S_4$ of the shift registers SR(1), SR(2), SR(3) and SR(4) are pulled up at time points $t_1$, $t_2$, $t_3$ and $t_4$ and pulled down at time points $t_2$, $t_3$, $t_4$ and $t_5$, respectively. In addition, the clock signal XCLK is provided to the shift registers SR(1) and SR(3); and the clock signal CLK is provided to the shift registers SR(2) and SR(4).

Herein the shift register SR(3) is took as an example. When the start signal ST is transmitted to the shift register SR(3) at the time point $t_1$, the voltage level of the node $A_2$ in the shift register SR(3) is also pulled up to VGH-$V_{th}$. Then, with the clock signal XCLK being pulled up, the voltage level of the node $A_2$ in the shift register SR(3) is further pulled up to about VGH-VGL (VGL is a low operating voltage level) at the time point $t_3$. However, because the circuit design flaw of the shift register SR(3), the node $A_2$ is in a floating state between the time points $t_2$~$t_3$ and the time points $t_4$~$t_5$. With the node $A_2$ being in a floating state, the voltage level of the node $A2$ may drop because of the leakage current. Once the voltage level dropping process is relatively long and the voltage level of the node $A_2$ is relatively low, the shift register SR(3) may not work normally.

SUMMARY

Therefore, an aspect of the present disclosure is to provide a shift register and a flat panel display using the same having improved performances.

The present disclosure provides a shift register configured to receive a previous-stage output signal, a start signal, a first clock signal, a second clock signal and a third clock signal. The shift register includes a control module and a driving module. The control module includes an input unit, a first control unit and a second control unit. The input unit includes an activation terminal. The input unit is configured to determine whether to transmit the start signal to the activation terminal or not according to the previous-stage output signal. The first control unit includes a first driving control terminal. The first control unit is electrically coupled to the activation terminal and configured to determine the first driving control terminal to receive a first operating voltage level or a second operating voltage level according to the voltage level of the activation terminal and the third clock signal. The second control unit includes a second driving control terminal. The second control unit is electrically coupled to the activation terminal and the first driving control terminal. The second control unit is configured to determine how to adjust the voltage level received by the activation terminal according to the voltage level of the first driving control terminal and the second clock signal and then provide the adjusted voltage level to the second driving control terminal. The driving module includes an output terminal, a driving voltage level determination unit, a first driving unit and a second driving unit. The driving voltage level determination unit includes a driving voltage level output terminal. The driving voltage level determination unit is electrically coupled to the first driving control terminal and the second driving control terminal. The driving voltage level determination unit is configured to determine whether to turn on an electrical channel between the driving voltage level output terminal and a specific node or not according to the voltage level of the first driving control terminal and determine whether to turn on an electrical channel between the driving voltage level output terminal and the second operating voltage level or not according to the voltage level of the second driving control terminal. The first driving unit is electrically coupled to the first driving control terminal and the output terminal. The first driving unit is configured to determine whether to turn on an electrical channel between the output terminal and the first operating voltage level or not according to the voltage level of the first driving control terminal. The second driving unit is electrically coupled to the driving voltage level output terminal and the output terminal. The second driving unit is configured to determine whether to transmit the first clock signal to the output terminal or not according to the voltage level of the driving voltage level output terminal.

The present disclosure further provides a flat panel display using the aforementioned shift registers. The flat panel display includes a display region, a first shift register region and a second shift register region. The display region is crossed by a plurality of gate lines. Each one of the plurality of gate lines is electrically coupled to at least a pixel circuit thereby determining whether to control the pixel circuit to receive a display data from a data line electrically coupled to the pixel circuit or not. The first shift register region is disposed between the display region and an edge of the flat panel display and is located on a first side of the flat panel display. The first shift register region includes a plurality of the shift registers connected in a cascade manner. The second shift register region is disposed between the display region and the edge of the flat panel display and is located on a second side of the flat panel display. The second shift register region includes a plurality of the shift registers connected in a cascade manner. The shift registers are sequentially and alternatively enabled by the first and second shift register regions. The first and second sides are two different sides of the flat panel display.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
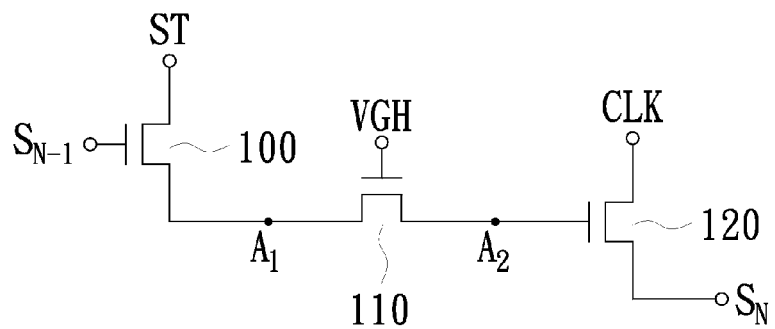
FIG. 1 is a circuit view of a part of a conventional shift register.
Figure 2A:
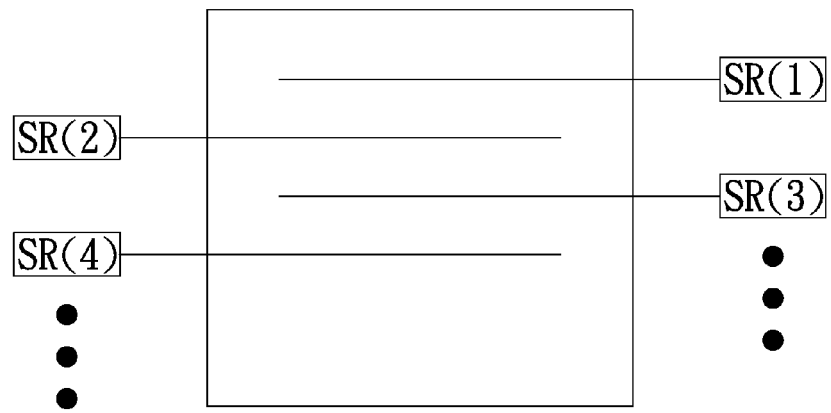
FIG. 2A is a circuit block view of a conventional flat panel display.
Figure 2B:
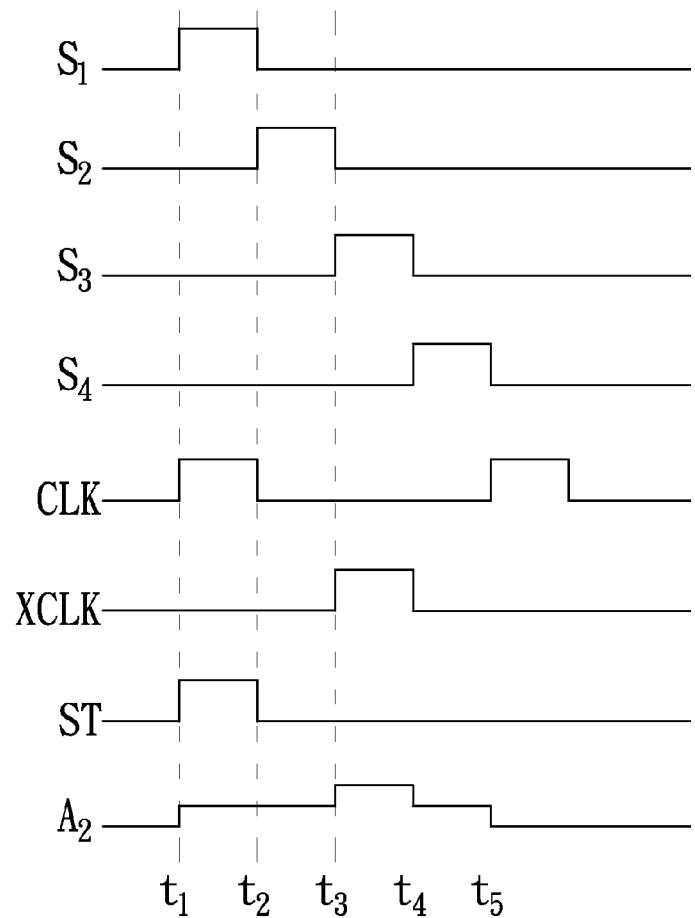
FIG. 2B is a timing chart of the related signals used for driving the conventional flat panel display of FIG. 2A.
Figure 3:
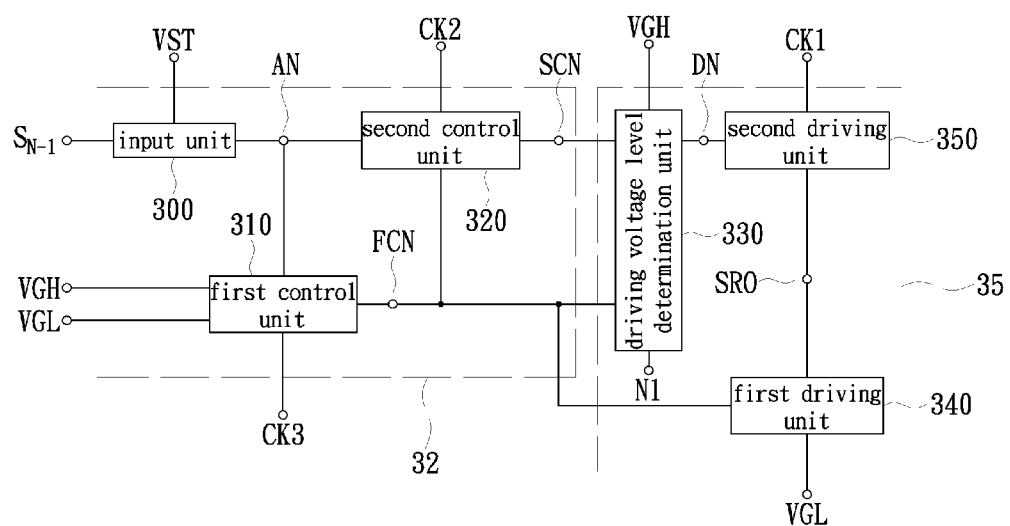
FIG. 3 is a circuit block view of a shift register in accordance with an embodiment of the present disclosure.

Referring to FIG. 3, which is a circuit block view of a shift register in accordance with an embodiment of the present disclosure. As shown, the shift register 30 in the present embodiment includes a control module 32 and a driving module 35. The control module 32 includes an input unit 300, a first control unit 310 and a second control unit 320. The driving module 35 includes a driving voltage level determination unit 330, a first driving unit 340 and a second driving unit 350. The following description is based on referring the shift register 30 as the Nth-stage shift register in a shift register region. Thus, the output signal of the shift register 30 is labeled as $S_N$; the output signal of the previous-stage shift register, relative to the shift register 30, is labeled as $S_{N-1}$; and the output signal of the next-stage shift register, relative to the shift register 30, is labeled as $S_{N+1}$.

As shown in FIG. 3, the input unit 300 receives the previous-stage output signal SN-1 and the start signal VST provided to the shift register 30. Specifically, the input unit 300 is configured to determine whether to transmit the voltage level of the start signal VST to an activation terminal AN of the input unit 300 or not according to the voltage level of the previous-stage output signal SN-1. The first control unit 310 is electrically coupled to the activation terminal AN and receives an operating voltage level VGL (hereafter is also called the first operating voltage having a voltage level value Vgl), an operating voltage level VGH (hereafter is also called the second operating voltage having a voltage level value Vgh) and a clock signal CK3 (hereafter is also called the third clock signal). Specifically, the first control unit 310 is configured to determine to transmit either the operating voltage level VGL or the operating voltage level VGH to the driving control terminal FCN (hereafter is also called the first driving control terminal) of the first control unit 310 according to the voltage levels provided by the activation terminal AN and the clock signal CK3. Or, from another perspective, the first control unit 310 is configured to control the driving control terminal FCN to receive either the operating voltage level VGL or the operating voltage level VGH according to the voltage levels of the activation terminal AN and the clock signal CK3. The second control unit 320 receives the clock signal CK2 (hereafter is also called the second clock signal) and is electrically coupled to the activation terminal AN and the driving control terminal FCN. Specifically, the second control unit 320 is configured to determine how adjust the voltage level received by the activation terminal AN according to the voltage levels of the driving control terminal FCN and the clock signal CK2 and then provide the adjusted voltage level to the driving control terminal SCN (hereafter is also called the second driving control terminal) thereof.

In the driving module 35, the driving voltage level determination unit 330 has a driving voltage level output terminal DN. The driving voltage level determination unit 330 receives the operating voltage level VGH and is electrically coupled to the aforementioned driving control terminals FCN and SCN. Specifically, the driving voltage level determination unit 330 is configured to determine whether to turn on the electrical channel between the driving voltage level output terminal DN and a specific node N1 or not according to the voltage level of the driving control terminal FCN. In addition, the driving voltage level determination unit 330 is further configured to determine whether to turn on the electrical channel between the driving voltage level output terminal DN and the operating voltage level VGH or not according to the voltage level of the driving control terminal SCN. The first driving unit 340 receives the operating voltage level VGL and is electrically coupled to the driving control terminal FCN and an output terminal SRO of the driving module 35. Specifically, the first driving unit 340 is configured to determine whether to turn on the electrical channel between the output terminal SRO and the operating voltage level VGL or not according to the voltage level of the driving control terminal FCN. The second driving unit 350 receives the clock signal CK1 (hereafter is also called the first clock signal) and is electrically coupled to the driving voltage level output terminal DN and an output terminal SRO. Specifically, the second driving unit 350 is configured to determine whether to transmit the voltage level of the clock signal CK1 to the output terminal SRO or not according to the voltage level of the driving voltage level output terminal DN.

The detailed circuit diagrams will be provided as follow. However, it is understood that these circuit diagrams are provided for exemplary purposes only, and the present disclosure is not limited thereto. In addition, the following embodiments are exemplarily implemented with N-type transistors. However, these N-type transistors in each embodiment are functioned as switches; thus, to those ordinarily skilled in the art it is understood that the these N-type transistors can be replaced by other types of switches and the present disclosure is not limited thereto.

Figure 4:
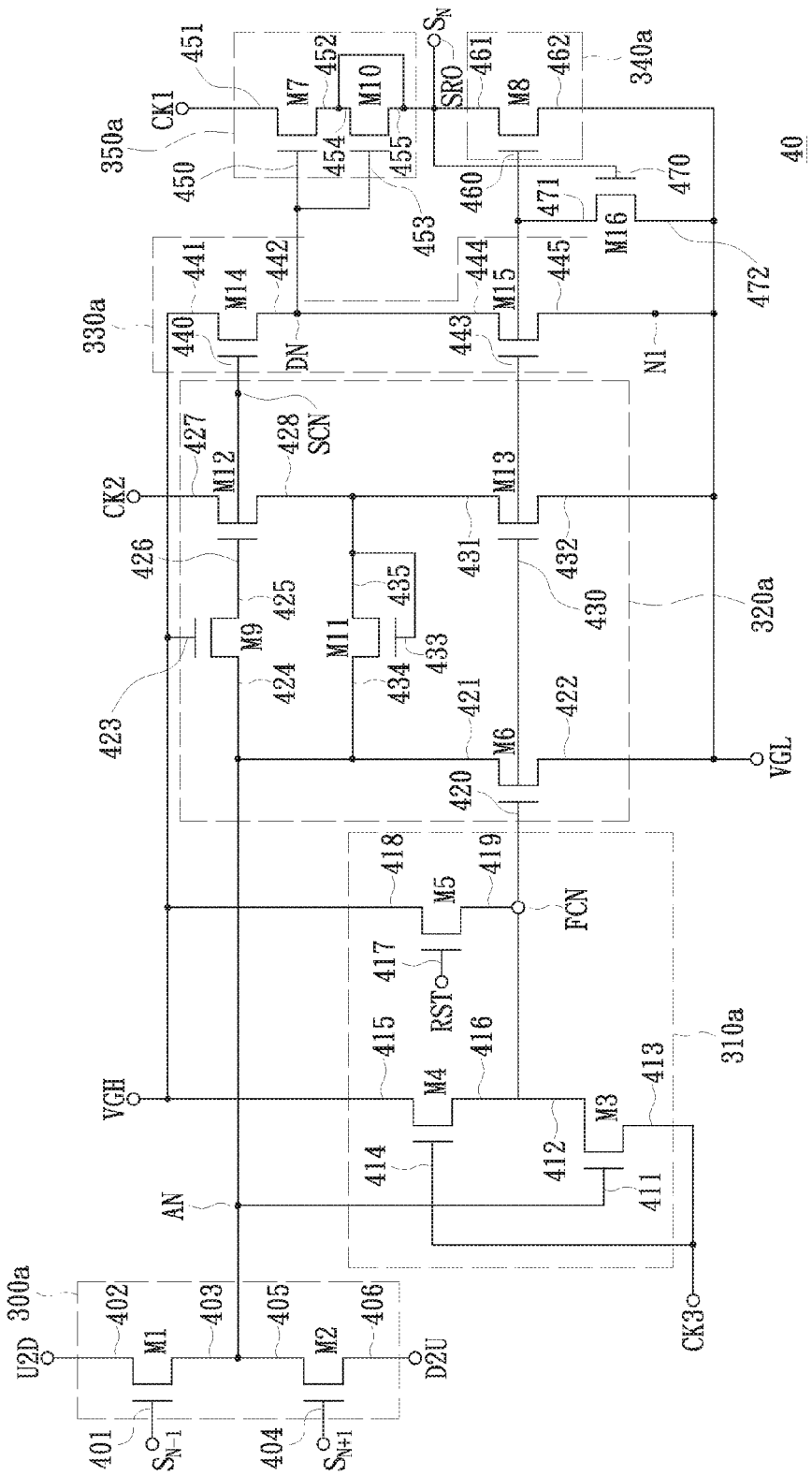
FIG. 4 is a circuit view of a shift register in accordance with an embodiment of the present disclosure.

Referring to FIG. 4, which is a circuit view of a shift register in accordance with an embodiment of the present disclosure. As shown, the input unit 300a in the present embodiment includes two N-type transistors M1 and M2. The N-type transistor M1 has a control terminal 401, a channel terminal 402 and a channel terminal 403. Specifically, the N-type transistor M1 is configured to have its control terminal 401 for receiving the previous-stage output signal $S_{N-1}$; its channel terminal 402 for receiving the forward-scan start signal U2D (that is, one of the start signals VST in FIG. 3); and its channel terminal 403 electrically coupled to the activation terminal AN. Similarly, the N-type transistor M2 has a control terminal 404, a channel terminal 405 and a channel terminal 406. Specifically, the N-type transistor M2 is configured to have its control terminal 404 for receiving the next-stage output signal $S_{N+1}$; its channel terminal 405 electrically coupled to the activation terminal AN; and its channel terminal 406 for receiving the backward-scan start signal D2U (that is, one of the start signals VST in FIG. 3).

To those ordinarily skilled in the art, it is understood that employment of both of the two N-type transistors M1 and M2 in the input unit 300a at the same time is for making the shift register 40 in the present embodiment adapted to both of the from-top-to-bottom (or, forward) scan and the from-bottom-to-top (or, backward) scan. In other words, the N-type transistor M2 can be omitted and only the N-type transistor M1 is employed when the shift register 40 is used for the forward scan only. Alternatively, the N-type transistor M1 can be omitted and only the N-type transistor M2 is employed when the shift register 40 is used for the backward scan only. Additionally, in most conditions, the forward-scan start signal U2D can be replaced by the previous-stage output signal $S_{N-1}$ and the backward-scan start signal D2U can be replaced by the next-stage output signal $S_{N+1}$. In other words, in some conditions, the N-type transistor M1 may be configured to have its control terminal 401 and its channel terminal 402 electrically coupled with each other and for simultaneously receiving the previous-stage output signal $S_{N-1}$; and the N-type transistor M2 may be configured to have its control terminal 404 and its channel terminal 406 electrically coupled with each other and for simultaneously receiving the next-stage output signal $S_{N+1}$.

Please referring to FIG. 4, again. The first control unit 310a in the present embodiment includes N-type transistors M3, M4 and M5. Specifically, the N-type transistor M3 is configured to have its control terminal 411 electrically coupled to the activation terminal AN; its channel terminal 412 electrically coupled to driving control terminal FCN; and its channel terminal 413 for receiving the clock signal CK3. The N-type transistor M4 is configured to have its control terminal 414 for receiving the clock signal CK3; its channel terminal 415 for receiving the operating voltage level VGH; and its channel terminal 416 electrically coupled to driving control terminal FCN. The N-type transistor M5 is configured to have its control terminal 417 for receiving a reset signal RST; its channel terminal 418 for receiving the operating voltage level VGH; and its channel terminal 419 electrically coupled to driving control terminal FCN.

In the first control unit 310a, the N-type transistor M5 is used for resetting the state of the shift register 40. Specifically, the N-type transistor M5 is turned on once the reset signal RST is pulled up to have a high voltage level. With the N-type transistor M5 being turned on, the driving control terminal FCN is pulled up to have a voltage level closes to the operating voltage level VGH; and consequentially the N-type transistors M6, M13, M15 and M18 are tuned on together. With the N-type transistor M6 being turned on, the activation terminal AN is pulled down to have a voltage level closes to the operating voltage level VGL; and consequentially the N-type transistors M12 and M14 are maintained in a turn-off state and the driving control terminal SCN is pulled down to have a voltage level closes to the operating voltage level VGL. With the N-type transistor M13 being turned on, the electrical channel between the channel terminal of the N-type transistor M13 and the channel terminal 428 of the N-type transistor M12 is pulled down to have a voltage level closes to the operating voltage level VGL. With the N-type transistor M15 being turned on, the driving voltage level output terminal DN is pulled down to have a voltage level closes to the operating voltage level VGL; and consequentially the N-type transistors M7 and M10 are maintained in a turn-off state. With the N-type transistor M8 being turned on, the output terminal SRO is pulled down to have a voltage level closes to the operating voltage level VGL; and consequentially the output signal $S_N$ is pulled down to a low voltage level.

Therefore, by pulling up the reset signal RST to have a high voltage level, the whole shift register 40 can be reset to a non-enable state. To those ordinarily skilled in the art, it is understood that the shift register 40 may not need the N-type transistor M5 if the shift register 40 does not need the reset function or the shift register 40 can be reset through other ways. In addition, even the shift register 40 needs to be equipped with the reset function provided by the N-type transistor M5, it is not necessary to restrict the N-type transistor M5 to be arranged at this specific position as illustrated in FIG. 4.

Figure 5A:
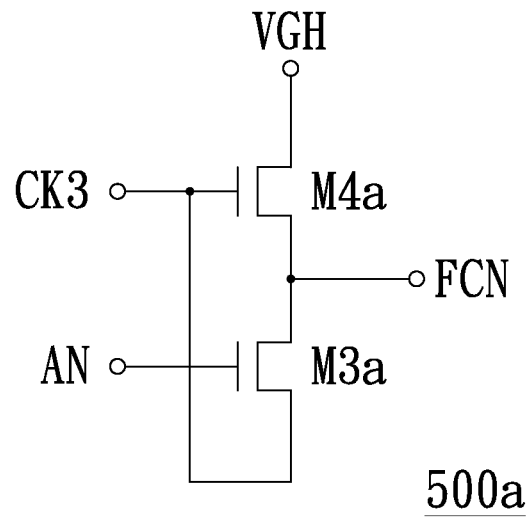
FIG. 5A is a circuit view of a first control unit in accordance with another embodiment of the present disclosure.

Referring to FIG. 5A, which is a circuit view of a first control unit in accordance with another embodiment of the present disclosure. The first control unit 500a in the present embodiment includes N-type transistors M3a and M4a. As shown, the circuit coupling relationships of the N-type transistors M3a and M4a in FIG. 5A are same as that of the N-type transistors M3 and M4 in FIG. 4, respectively; and no redundant detail is to be given herein. Being different with the first control unit 310a in FIG. 4, the first control unit 500a in FIG. 5A does not have the N-type transistor M5. As previously described, the first control unit 500a still has normal functions even without the N-type transistor M5.

Figure 5B:
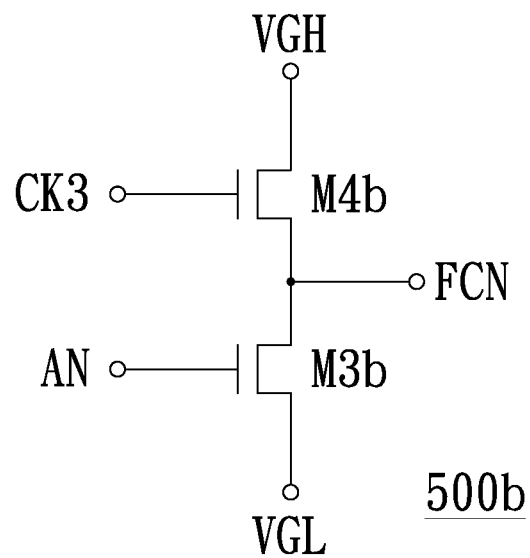
FIG. 5B is a circuit view of a first control unit in accordance with another embodiment of the present disclosure.

Next, referring to FIG. 5B, which is a circuit view of a first control unit in accordance with another embodiment of the present disclosure. The first control unit 500b in the present embodiment includes N-type transistors M3b and M4b. As shown, the circuit coupling relationships of the N-type transistors M3b and M4b in FIG. 5B are almost same as that of the N-type transistors M3 and M4 in FIG. 5A, respectively. The main difference between the two is that one channel terminal of the N-type transistor M3b is for receiving the operating voltage level VGL instead of receiving the clock signal CK3 as the N-type transistor M3a does in FIG. 5A. Although the two N-type transistors M3a and M3b have the difference, the first control unit 500a in FIG. 5A and the first control unit 500b in FIG. 5B have the same operation result. This is because, when the clock signal CK3 has a high voltage level, both of the transistor M4a in FIG. 5A and the transistor M4b in FIG. 5B are turned on regardless the activation terminal AN has a high voltage level or a low voltage level; and consequentially the driving control terminal FCN is pulled up to have a voltage level close to the operating voltage level VGH. Alternatively, when the clock signal CK3 has a low voltage level, both of the transistor M4a in FIG. 5A and the transistor M4b in FIG. 5B are turned off and both of the transistor M3a in FIG. 5A and the transistor M3b in FIG. 5B are turned on; and consequentially the driving control terminal FCN is pulled down to have a voltage level close to the operating voltage level VGL (herein it is assumed that the low voltage level of the clock signal CK3 is equal to the $V_{gl}$ of the operating voltage level VGL). However, for a circuit safety and avoiding the circuit short, it is understood that the activation terminal AN and the clock signal CK3 are prevented from having a high voltage level at the same time.

Please referring to FIG. 4, again. As shown, the second control unit 320a in the present embodiment includes N-type transistor M6, M9, M11, M12 and M13. Specifically, the N-type transistor M6 is configured to have its control terminal 420 electrically coupled to the driving control terminal FCN; its channel terminal 421 electrically coupled to the activation terminal AN; and its channel terminal 422 for receiving the operating voltage level VGL. The N-type transistor M9 is configured to have its control terminal 423 for receiving the operating voltage level VGH; its channel terminal 424 electrically coupled to the activation terminal AN; and its channel terminal 425 electrically coupled to the driving control terminal SCN. The N-type transistor M12 is configured to have its control terminal 426 electrically coupled to the driving control terminal SCN; its channel terminal 427 for receiving the clock signal CK2; and its channel terminal 428 electrically coupled to the channel terminal 431 of the N-type transistor M13. The N-type transistor M13 is configured to have its control terminal 430 electrically coupled to the driving control terminal FCN; and its channel terminal 432 for receiving the operating voltage level VGL. The N-type transistor M11 is configured to have both of its control terminal 433 and its channel terminal 435 electrically coupled to the channel terminal 428 of the N-type transistor M12; and its channel terminal 434 electrically coupled to the activation terminal AN.

Figure 6:
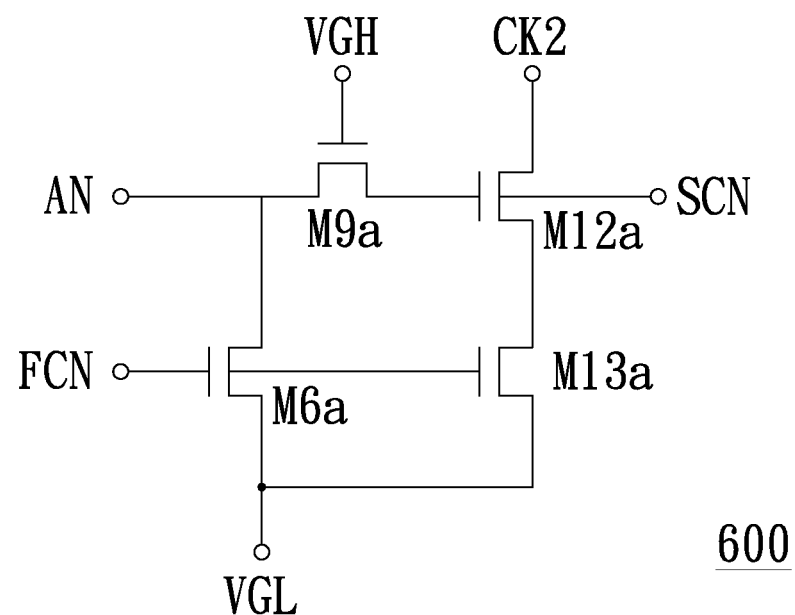
FIG. 6 is a circuit view of a second control unit in accordance with another embodiment of the present disclosure.

In the second control unit 320a, the N-type transistor M11 is optional and can be omitted. Please referring to FIG. 6, which is a circuit view of a second control unit in accordance with another embodiment of the present disclosure. The second control unit 320a in the present embodiment includes N-type transistor M6a, M9a, M12a and M13a. As shown, the circuit coupling relationships of the N-type transistors M6a, M9a, M12a and M13a in FIG. 6 are same as that of the N-type transistors M6, M9, M12 and M13 in FIG. 4, respectively; and no redundant detail is to be given herein. In addition, the second control unit 320a still has normal functions even without the N-type transistor M11 in FIG. 4.

Referring to FIG. 4, again. The driving voltage level determination unit 330a in the present embodiment includes N-type transistors M14 and M15. As shown, the N-type transistor M14 is configured to have its control terminal 440 electrically coupled to the driving control terminal SCN; its channel terminal 441 for receiving the operating voltage level VGH; and its channel terminal 442 electrically coupled to the driving voltage level output terminal DN. The N-type transistor M15 is configured to have its control terminal 443 electrically coupled to the driving control terminal FCN; its channel terminal 444 electrically coupled to driving voltage level output terminal DN; and its channel terminal 445 electrically coupled to the node N1 and through which to receive the operating voltage level VGL.

Furthermore, the first driving unit 340a in the present embodiment includes an N-type transistor M8. As shown, the N-type transistor M8 is configured to have its control terminal 460 electrically coupled to the driving control terminal FCN; its channel terminal 461 electrically coupled to the output terminal SRO; and its channel terminal 462 for receiving the operating voltage level VGL. The second driving unit 350a in the present embodiment includes N-type transistors M7 and M10. As shown, the N-type transistor M7 is configured to have its control terminal 450 electrically coupled to the driving voltage level output terminal DN; its channel terminal 451 for receiving the clock signal CK1; and its channel terminal 452 electrically coupled to the output terminal SRO. The N-type transistor M10 is configured to have its control terminal 453 electrically coupled to the driving voltage level output terminal DN; and both of its channel terminals 454 and 455 electrically coupled to the output terminal SRO. Through the aforementioned circuit connection, the N-type transistor M10 is functioned like a charge storage element of a capacitor. Thus, the N-type transistor M10 can be replaced by any type of capacitive element in response to an actual circuit design requirement. Or, from another perspective, the N-type transistor M10 can be replaced through the feed-through effect of the N-type transistor M7. In other word, even without the N-type transistor M10 or any capacitive for replacing the N-type transistor M10, the second driving unit 350a still can function normally.

Figure 7A:
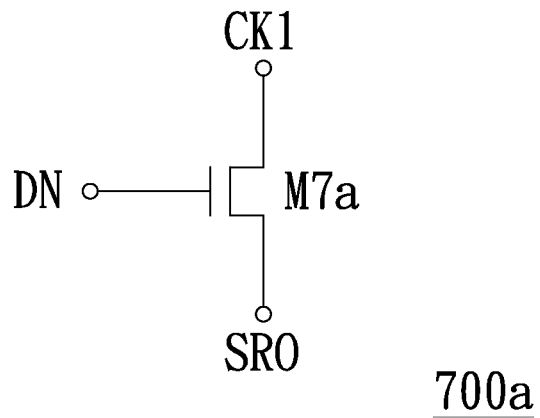
FIG. 7A is a circuit view of a second driving unit in accordance with another embodiment of the present disclosure.
Figure 7B:
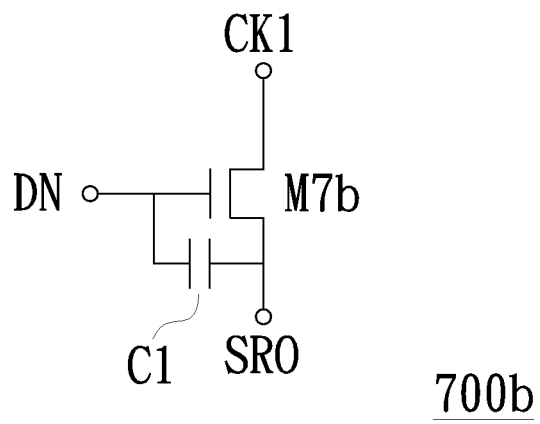
FIG. 7B is a circuit view of a second driving unit in accordance with another embodiment of the present disclosure.

Referring to FIG. 7A, which is a circuit view of a second driving unit in accordance with another embodiment of the present disclosure. As shown, the second driving unit 700a in the present embodiment only includes an N-type transistor M7a and has no any capacitive element. Please referring to FIG. 7B, which is a circuit view of a second driving unit in accordance with another embodiment of the present disclosure. As shown, besides the N-type transistor M7b, the second driving unit 700b in the present embodiment further includes a capacitor C1. According to the previous descriptions, both of the second drive units 700a and 700b can have the operation effect provided by the second driving unit 350a shown in FIG. 4; thus, any one of the second drive units 700a and 700b can be selected to replace the second driving unit 350a.

Referring to FIG. 4, again. The shift register 40 further includes an N-type transistor M16. The N-type transistor M16 is configured to have its control terminal 470 electrically coupled to the output terminal SRO; its channel terminal 471 electrically coupled to the driving control terminal FCN; and its channel terminal 472 for receiving the operating voltage level VGL. The main function of the N-type transistor M16 is for pulling down the voltage level of the driving control terminal FCN when the output terminal SRO has a high voltage level, thereby stably maintaining the N-type transistor M8 in a turn-off state and consequentially reducing the voltage level variation at the output terminal SRO resulted by the leakage current. In fact, the N-type transistor M16 is not an essential element in the shift register of the present disclosure; in other words, the N-type transistor M16 may be selected or omitted based on the actual error allowable range.

Figure 8:
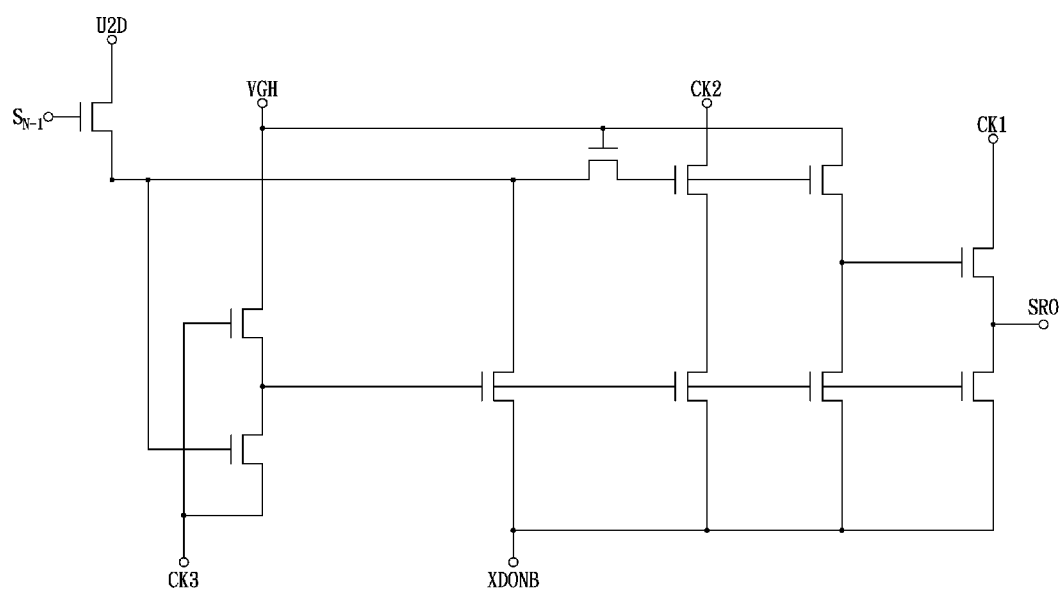
FIG. 8 is a circuit view of a shift register in accordance with another embodiment of the present disclosure.

FIG. 8 is a circuit view of a shift register in accordance with another embodiment of the present disclosure. As shown, without reducing the circuit effect but also having less number of element, most of the elements capable of being omitted in the aforementioned embodiment are omitted in the present embodiment. Because the coupling relationships among the elements in FIG. 8 have been described, no redundant detail is to be given herein. Specifically, in the present embodiment of FIG. 8, a refresh signal XDONB is introduced for replacing the operating voltage level VGL. The refresh signal XDONB is functioned as the operating voltage level VGL when the shift register functions normally; however, the refresh signal XDONB can be pulled up for resetting images when an abnormal shutdown occurs. The detailed operation will be described later with related drawings.

Figure 9:
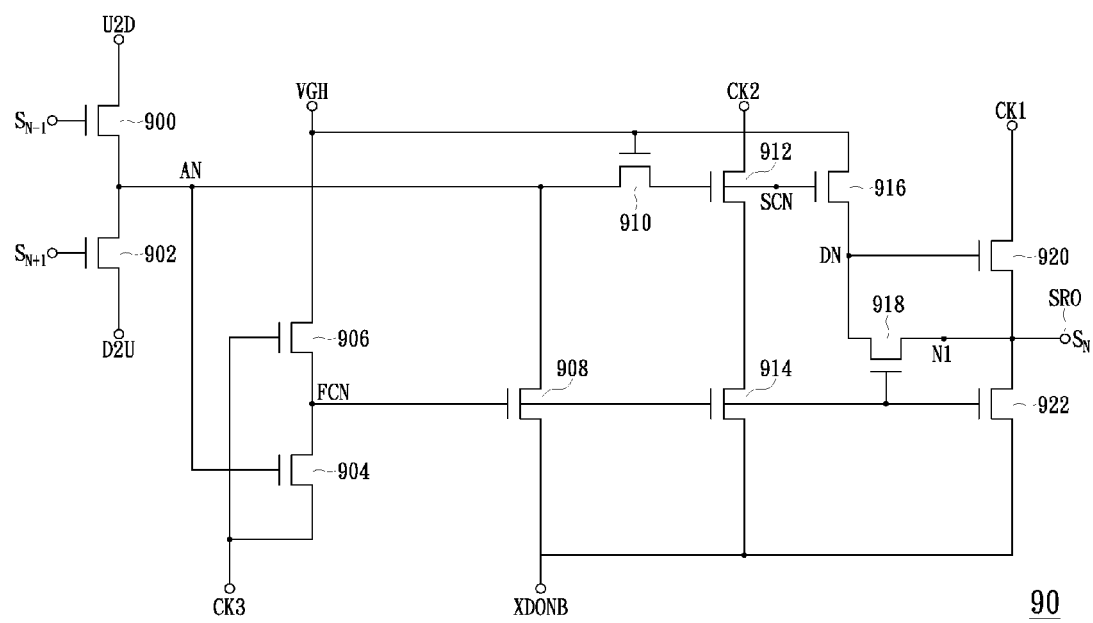
FIG. 9 is a circuit view of a shift register in accordance with another embodiment of the present disclosure.

Next, referring to FIG. 9, which is a circuit view of a shift register in accordance with another embodiment of the present disclosure. As shown, the shift register 90 in the present embodiment includes N-type transistors 900, 902, 904, 906, 908, 910, 912, 914, 916, 918, 920 and 922. Compared with the shift register 40 of FIG. 4, the coupling relationships of the N-type transistors 900, 902, 904, 906, 908, 910, 912, 914, 916, 918, 920 and 922 in FIG. 9 are same as that of the N-type transistors M1, M2, M3, M4, M6, M9, M12, M13, M14, M7 and M8 in FIG. 4, respectively; and no redundant detail is to be given herein. In addition, it is to be noted that the N-type transistor 918 in the shift register 90 has a function similar to that of the N-type transistor M15 in the shift register 40 but two have different electrically-coupling relationships. Specifically, both of the N-type transistors 918 and M15 are configured to have their control terminals electrically coupled to the driving control terminal FCN; both of their one channel terminals electrically coupled to the driving voltage level output terminal DN. However, the specific node N1, electrically coupled to the other channel terminal of the N-type channel transistor M15, is electrically coupled to the operating voltage level VGL (or, the refresh signal XDONB); but the specific node N1, electrically coupled to the other channel terminal of the N-type channel transistor 918, is electrically coupled to the output terminal SRO. This specific circuit design in the shift register 90 in the present embodiment is for reducing the change amplitude of the voltage level of the driving voltage level output terminal DN resulted by the leakage current of the N-type transistor 918 and consequentially being capable of operating the shift register 90 more stably.

Figure 10:
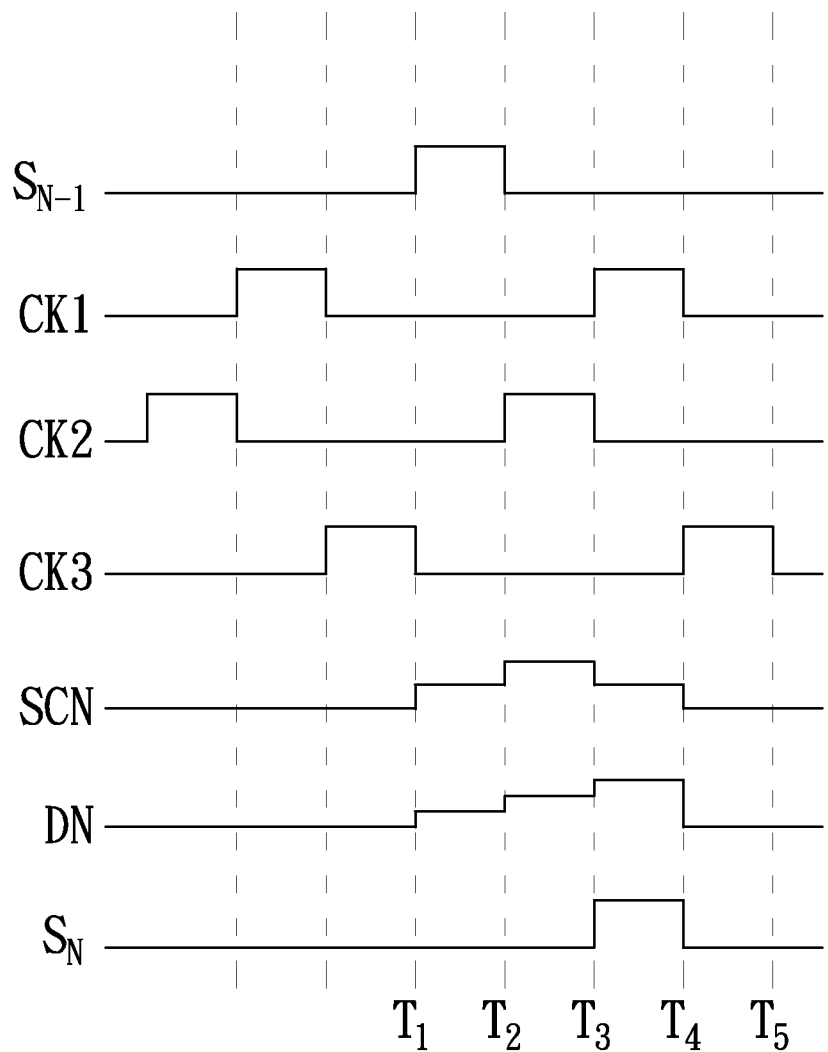
FIG. 10 is a timing chart of the related signals of an operation of a shift register in accordance with an embodiment of the present disclosure.

The detailed operation of the shift register 90 of FIG. 9 will be described as follow with a reference of FIG. 10, which is a timing chart of the related signals of an operation of a shift register in accordance with an embodiment of the present disclosure. As shown in FIG. 10, the enable periods of the clock signals CK1, CK2 and CK3 do not overlap one another; in addition, beginning from the time point $T_1$, the enable periods of the previous-stage output signal $S_{N-1}$, the clock signal CK2, the clock signal CK1 and the clock signal CK3 sequentially occur. In addition, when the shift register 90 is specifically operated in the forward scan, the start signal U2D is maintained at a high voltage level and the start signal D2U is maintained at a low voltage level. Moreover, normally the refresh signal XDONB is maintained to have a voltage level same as the operating voltage level VGL; or from another perspective, the refresh signal XDONB is to be used as the operating voltage level VGL under a normal condition.

During the period between the time points $T_1$ and $T_2$, the previous-stage output signal $S_{N-1}$ is converted to have a high voltage level; thus, the N-type transistor 900 is turned on and the voltage level of the activation terminal AN will is associated with the voltage level of the start signal U2D. Because the high-voltage-level start signal U2D has a voltage level value $V_{gh}$ of the operating voltage level VGH, the voltage level of the activation terminal AN is maintained to have a voltage level value around $V_{gh}$-$V_{th}$ ($V_{th}$ is the threshold voltage of an N-type transistor) during the period between the time points $T_1$ and $T_2$. Because the control terminal of the N-type transistor 910 is electrically coupled to the operating voltage level VGH, the N-type transistor 910 is maintained in a turned-on state. Accordingly, during the period between the time points $T_1$ and $T_2$, the voltage level of the driving control terminal SCN is maintained to have a voltage level value around $V_{gh}$-$V_{th}$, same as that of the activation terminal AN. With the voltage level of the activation terminal AN being pulled up to a high voltage level, the N-type transistor 904 is turned on. Because meanwhile the clock signal CK3 remains in a low-voltage-level state, the N-type transistor 906 is in a turned-off state and the driving control terminal FCN is maintained in a low-voltage-level state during the period between the time points $T_1$ and $T_2$.

During the period between the time points $T_1$ and $T_2$, because the driving control terminal FCN has a low voltage level, the N-type transistors 908, 914, 918 and 922 are maintained in a turned-off state. In contrast, during the period between the time points $T_1$ and $T_2$, because the driving control terminal SCN has a high voltage level, the N-type transistors 912 and 916 are maintained in a turned-on state. Accordingly, with the N-type transistor 916 being turned on, the driving voltage level output terminal DN is pulled up to a high-voltage-level state having a voltage level value $V_{gh}$-$2V_{th}$. Through the driving voltage level output terminal DN having a high voltage level, the N-type transistor 920 is turned on and provides the voltage level of the clock signal CK1 to the output SRO thereby configuring the output signal $S_N$ to have a low voltage level during the period between the time points $T_1$ and $T_2$.

Next, during the period between the time points $T_2$ and $T_3$, the previous-stage output signal $S_{N-1}$, the clock signal CK1 and the clock signal CK3 are maintained to have a low voltage level and the clock signal CK2 is maintained to have a high voltage level. In this period, the status of the whole shift register 90 almost has no change except the N-type transistor 912, Specifically, because the clock signal CK2 is converted from a low voltage level to a high voltage level, the voltage level of the driving control terminal SCN is also greatly increased by the feed-through effect of the N-type transistor 912. Because the low-voltage-level clock signal CK2 usually has a voltage level value $V_{gl}$ of the operating voltage level VGL and the high-voltage-level clock signal CK2 usually has a voltage level value $V_{gh}$ of the operating voltage level VGH, the voltage level value of the driving control terminal SCN is converted from original $V_{gh}-2V_{th}$ to $2V_{gh}-2V_{th}-V_{gl}$ by being added with $V_{gh}-V_{gl}$. Because the pulled-up voltage level of the driving control terminal SCN is much higher than voltage level value $V_{gh}$, the voltage level of the driving voltage level output terminal DN can be approximately equal to the operating voltage level VGH when the operating voltage level VGH is transmitted to the driving voltage level output terminal DN through the N-type transistor 916. In other words, because the voltage level of the driving control terminal SCN is greatly pulled up, the voltage level value of the driving voltage level output terminal DN can be slightly increased from $V_{gh}-2V_{th}$ to $V_{gh}$.

Next, during the period between the time points $T_3$ and $T_4$, the clock signal CK2 is pulled down to have a low voltage level and the clock signal CK1 is pulled up to have a high voltage level. Because the clock signal CK2 is converted from a high voltage level to a low voltage level in this period, the voltage level of the driving control terminal SCN is decreased from the voltage level value $2V_{gh}-2V_{th}-V_{gl}$ to the voltage level value $V_{gh}-2V_{th}$ by the feed-through effect of the N-type transistor 912. At the same time, because the clock signal CK1 is converted from a low voltage level to a high voltage level, the voltage level of the driving voltage level output terminal DN is added with the voltage level value $V_{gh}-V_{gl}$ by the feed-through effect of the N-type transistor 912. In other words, during the period between the time points $T_3$ and $T_4$, the voltage level of the driving voltage level output terminal DN is decreased from the voltage level value $V_{gh}$ to the voltage level value $2V_{gh}-V_{gl}$. Accordingly, the voltage level of the clock signal CK1 is transmitted to the output terminal SRO thereby converting the output signal $S_N$ from a low voltage level to a high voltage level.

Next, during the period between the time points $T_4$ and $T_5$, the clock signal CK1 is converted back to a low voltage level and the clock signal CK3 is converted to a high voltage level. With the clock signal CK3 being converted to a high voltage level, the N-type transistor 906 is turned on. Therefore, either through the voltage level of the clock signal CK3 transmitted to the driving control terminal FCN via the N-type transistor 904 or the operating voltage level VGH transmitted to the driving control terminal FCN via the N-type transistor 906, the driving control terminal FCN is pulled up to have a high voltage level and consequentially the N-type transistors 908, 914, 918 and 922 are turned on. With the N-type transistor 908 being turned on, both of the voltage levels of the activation terminal AN and the driving control terminal SCN are pulled down to the operating voltage level VGL and consequentially the N-type transistors 904, 912 and 916 are converted to a turned-off state. With the N-type transistors 918 and 922 being turned on, the output signal SRO receives the refresh signal XDONB (having a voltage level value $V_{gl}$ in a normal operation) through the N-type transistor 922 and also receives the voltage level of the clock signal CK1 (a low voltage level) through the N-type transistor 920 at the same time, thereby reducing the voltage level of the output signal $S_N$ to $V_{gl}$. Similarly, through the N-type transistors 922 and 918, the driving voltage level output terminal DN receives the refresh signal XDONB, so the voltage level of the driving voltage level output terminal DN is pulled down to a low voltage level and consequentially the N-type transistor 920 is in a turned-off state.

According to the above description, the N-type transistors 908, 914, 918 and 920 are in the turned-on state after the shift register 90 has one normal operation cycle. Therefore, when an expected shutdown occurs during the image displaying process, the output signal $S_N$ can be converted to have a high voltage level through converting the refresh signal XDONB to have a high voltage level, thereby releasing the charges stored in the pixels controlled by the output signal $S_N$. Thus, the being-displayed screen can have a pure color image without the residual image.

Figure 11:
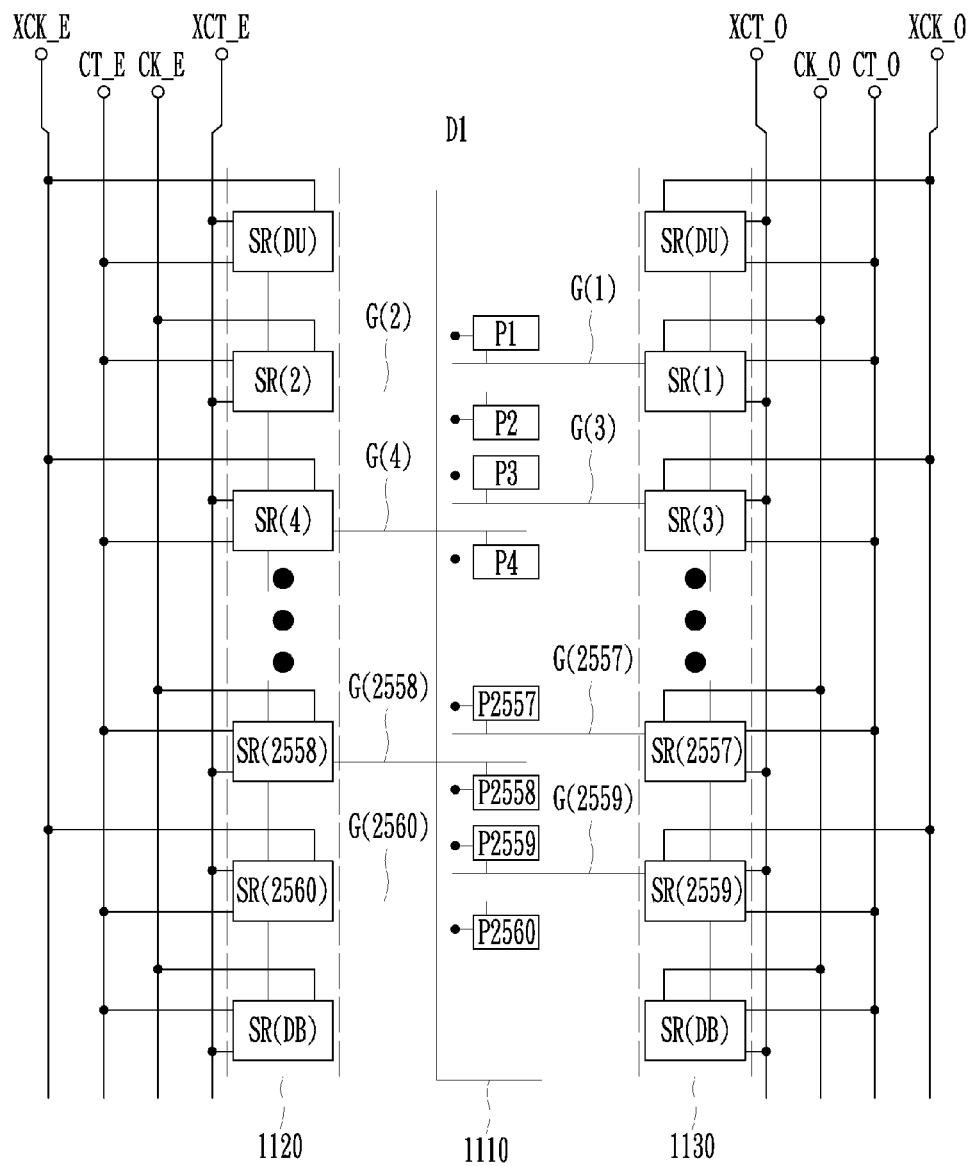
FIG. 11 is a circuit block view of a flat panel display in accordance with an embodiment of the present disclosure.

FIG. 11 is a circuit block view of a flat panel display in accordance with an embodiment of the present disclosure. As shown, the flat panel display in the present embodiment includes a display region 1110 and shift register regions 1120 and 1130. The display region 1110 is crossed by gate lines G(1), G(2), G(3), G(4), . . . , G(2557), G(2558), G(2559) and G(2660). The "cross" herein refers to that these gate lines are extended from the first external side of the display region 1110 to the second side of the display region 1110 through the internal of the display region 1110; however, it is to be noted that these gate lines are not necessary to reach to the edge of the second side or even cross out the second side of the display region 1110. Each gate line G(1), G(2), G(3), G(4), . . . , G(2557), G(2558), G(2559) and G(2660) is electrically coupled to at least one pixel circuit and configured to control the respective pixel circuit to determine whether to receive the display data from the electrically-coupled data line or not. For example, the gate line G(1) is electrically coupled to the pixel circuit P1 thereby controlling the pixel circuit P1 to determine whether to receive the display data from the data line D1 or not. Similarly, the gate line G(2) is electrically coupled to the pixel circuit P2 thereby controlling the pixel circuit P2 to determine whether to receive the display data from the data line D1 or not; the gate line G(3) is electrically coupled to the pixel circuit P3 thereby controlling the pixel circuit P3 to determine whether to receive the display data from the data line D1 or not; the gate line G(4) is electrically coupled to the pixel circuit P4 thereby controlling the pixel circuit P4 to determine whether to receive the display data from the data line D1 or not; . . . ; the gate line G(2560) is electrically coupled to the pixel circuit P2560 thereby controlling the pixel circuit P2560 to determine whether to receive the display data from the data line D1 or not.

The shift register region 1120 is disposed between the display region 1110 and an edge of the flat panel display. As shown, the shift register 120 is disposed on the left of the flat plane display and includes a plurality of cascade-connected shift registers SR(DU), SR(2), SR(4), . . . , SR(2558), SR(2560) and SR(DB). In addition, the shift register region 1120 is configured to be controlled by the signal lines XCK_E, CK_E, XCT_E and CT_E and accordingly generate corresponding output signals. In the present embodiment, the signal provided by the signal line XCK_E corresponds to the clock signal CK1 of the shift registers SR(DU), SR(4), . . . , SR(2560) in the shift register region 1120; the signal provided by the signal line CK_E corresponds to the clock signal CK1 of the shift registers SR(2), . . . , SR(2558), SR(DB) in the shift register region 1120; the signal provided by the signal line XCT_E corresponds to the clock signal CK2 of the shift registers SR(DU), SR(4), . . . , SR(2560) in the shift register region 1120 and corresponds to the clock signal CK3 of the shift registers SR(2), . . . , SR(2558), SR(DB) in the shift register region 1120; and the signal provided by the signal line CT_E corresponds to the clock signal CK3 of the shift registers SR(DU), SR(4), . . . , SR(2560) in the shift register region 1120 and corresponds to the clock signal CK2 of the shift registers SR(2), . . . , SR(2558), SR(DB) in the shift register region 1120.

The shift register region 1130 is also disposed between the display region 1110 and an edge of the flat panel display. As shown, the shift register 1130 is disposed on the right of the flat plane display and includes a plurality of cascade-connected shift registers SR(DU), SR(1), SR(3), . . . , SR(2557), SR(2559) and SR(DB). In addition, the shift register region 1130 is configured to be controlled by the signal lines XCK_O, CK_O, XCT_O and CT_O and accordingly generate corresponding output signals. In the present embodiment, the signal provided by the signal line XCK_O corresponds to the clock signal CK1 of the shift registers SR(DU), SR(3), . . . , SR(2559) in the shift register region 1130; the signal provided by the signal line CK_O corresponds to the clock signal CK1 of the shift registers SR(1), . . . , SR (2557), SR(DB) in the shift register region 1130; the signal provided by the signal line XCT_O corresponds to the clock signal CK2 of the shift registers SR(DU), SR(3), . . . , SR(2559) in the shift register region 1130 and corresponds to the clock signal CK3 of the shift registers SR(1), . . . , SR(2557), SR(DB) in the shift register region 1130; and the signal provided by the signal line CT_O corresponds to the clock signal CK3 of the shift registers SR(DU), SR(3), . . . , SR(2559) in the shift register region 1130 and corresponds to the clock signal CK2 of the shift registers SR(1), . . . , SR(2557), SR(DB) in the shift register region 1130.

Figure 12:
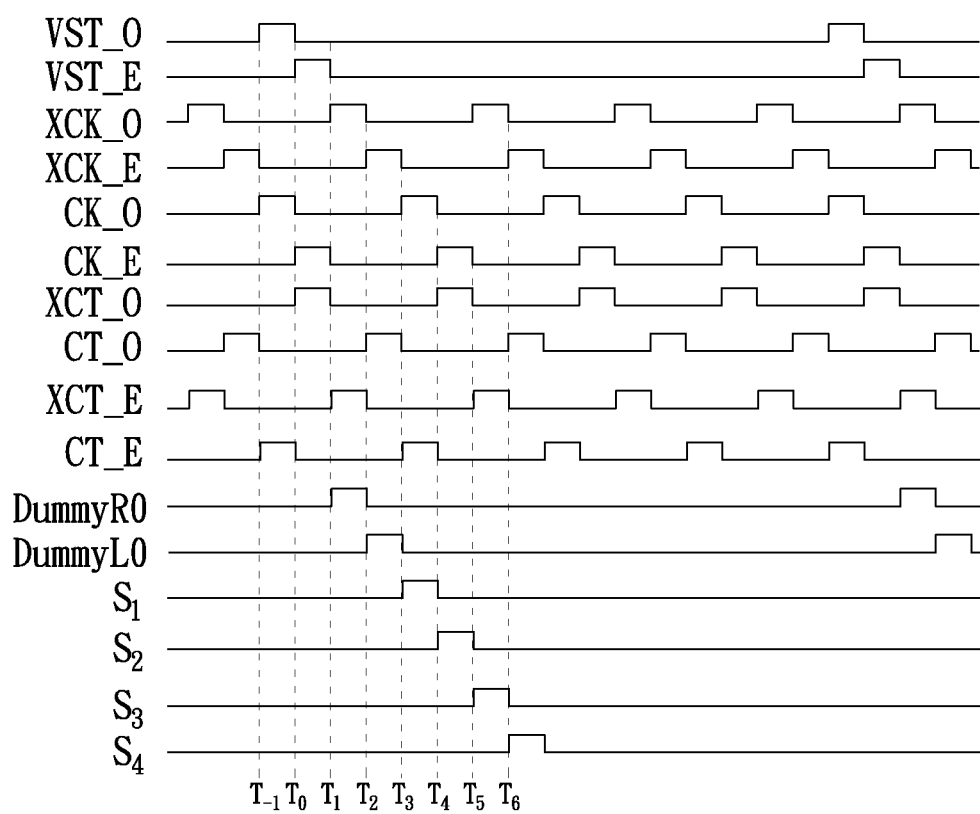
FIG. 12 is a timing chart of the related signals for an operation of a flat panel display in accordance with an embodiment of the present disclosure.

Please referring to FIGS. 11 and 12. FIG. 12 is a timing chart of the related signals for an operation of a flat panel display in accordance with an embodiment of the present disclosure. Specifically, the signal $S_1$ is the output signal of the shift register SR(1); the signal $S_2$ is the output signal of the shift register SR(2); the signal $S_3$ is the output signal of the shift register SR(3); the signal $S_4$ is the output signal of the shift register SR(4); the signal DummyR0 is the output signal of the shift register SR(DU) in the shift register region 1130; and the signal DummyL0 is the output signal of the shift register SR(DU) in the shift register region 1120.

When the forward scan is performed, the start signal VST_O of the shift register region 1130 is provided to the shift register SR(DU) in the shift register region 1130 during the period between the time points $T_{-1}$ and $T_0$; thus, according to the operation process illustrated in FIG. 10, the output signal DummyR0 outputted from the shift register SR(DU) has a high voltage level during the period between the time points $T_{-1}$ and $T_0$. The high-voltage-level output signal DummyR0 is provided to the shift register SR(1) during the period between the time points $T_1$ and $T_2$; thus, according to the operation process illustrated in FIG. 10, the output signal $S_1$ outputted from the shift register SR(1) has a high voltage level during the period between the time points $T_3$ and $T_4$. Based on the same manner, the high-voltage-level output signal $S_1$ is provided to the shift register SR(3) during the period between the time points $T_3$ and $T_4$; thus, according to the operation process illustrated in FIG. 10, the output signal $S_3$ outputted from the shift register SR(3) has a high voltage level during the period between the time points $T_5$ and $T_6$. It is to be noted that the previous-stage shift register of the shift register SR(3) is the shift register SR(1), not the shift register SR(2).

Similarly, when the forward scan is performed, the start signal VST_E of the shift register region 1120 is provided to the shift register SR(DU) in the shift register region 1120 during the period between the time points $T_0$ and $T_1$; thus, according to the operation process illustrated in FIG. 10, the output signal DummyL0 outputted from the shift register SR(DU) has a high voltage level during the period between the time points $T_2$ and $T_3$. The high-voltage-level output signal DummyL0 is provided to the shift register SR(2) during the period between the time points $T_2$ and $T_3$; thus, according to the operation process illustrated in FIG. 10, the output signal $S_2$ outputted from the shift register SR(2) has a high voltage level during the period between the time points $T_4$ and $T_5$. Based on the same manner, the high-voltage-level output signal $S_2$ is provided to the shift register SR(4) during the period between the time points $T_4$ and $T_5$; thus, according to the operation process illustrated in FIG. 10, the output signal $S_4$ outputted from the shift register SR(4) has a high voltage level during the period begging from time point $T_6$. It is to be noted that the previous-stage shift register of the shift register SR(4) is the shift register SR(2), not the shift register SR(3).

Thus, according to the previously-described operation timing, the shift registers in the shift register regions 1130 and 1120 are sequentially and alternately enabled. More specifically, the shift register SR(DU) in the shift register region 1130 is enabled first, and accordingly the output signal DummyR0 thereof is pulled up to a high voltage level; then, the shift register SR(DU) in the shift register region 1120 is enabled, and accordingly the output signal DummyL0 thereof is pulled up to a high voltage level; then, the shift register SR(1) in the shift register region 1130 is enabled, and accordingly the output signal $S_1$ thereof is pulled up to a high voltage level; . . . ; eventually, the shift register SR(DB) in the shift register region 1120 is enabled. Thus, through the aforementioned driving sequence, the gate lines G(1), G(2), . . . , G(2560) are sequentially enabled from top to bottom thereby realizing the forward scan.

Figure 13:
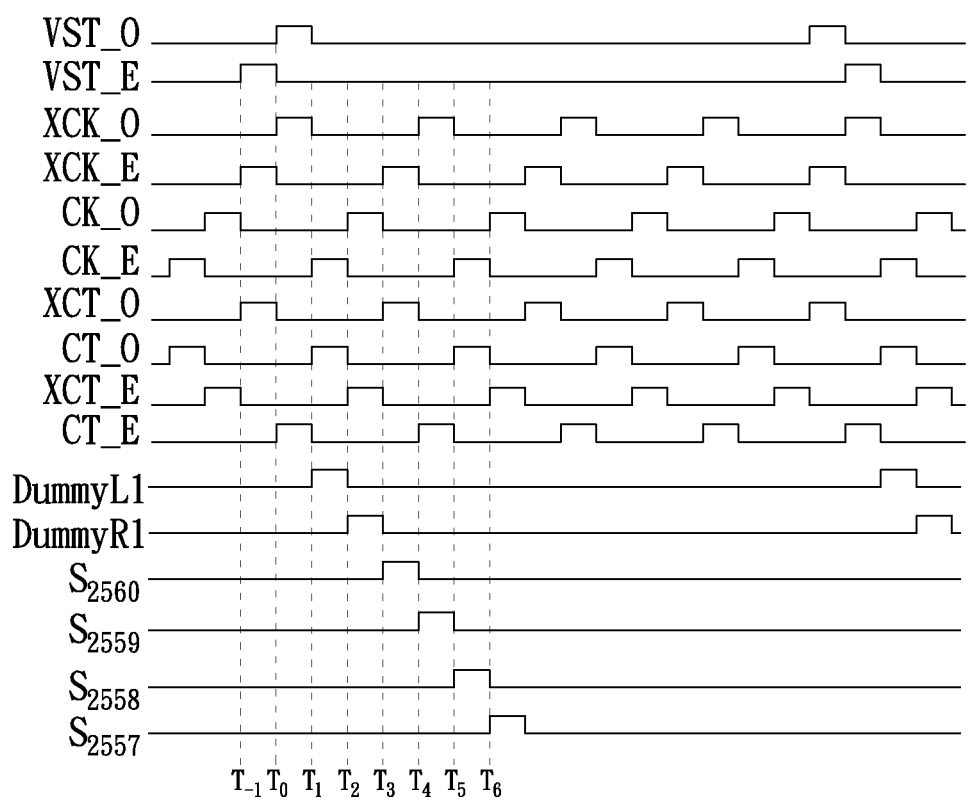
FIG. 13 is a timing chart of the related signals for an operation of a flat panel display in accordance with an embodiment of the present disclosure.

Please referring to FIGS. 11 and 13. FIG. 13 is a timing chart of the related signals for an operation of a flat panel display in accordance with an embodiment of the present disclosure. Compared with FIG. 12, the timing chart of FIG. 13 is specifically used for the backward scan. Because the backward scan is performed, one specific shift register in the shift register region 1120 is enabled first, and then one specific shift register in the shift register region 1130 is enabled. As shown, first, the start signal VST_E provided to the shift register region 1120 is enabled during the period between the time points $T_{-1}$ and $T_0$, and then the start signal VST_O provided to the shift register region 1130 is enabled during the period between the time points $T_0$ and $T_1$. In addition, because the backward scan is performed, the start signal VST_E is specifically provided to the shift register SR(DB) in the shift register region 1120, and the start signal VST_O is specifically provided to the shift register SR(DB) in the shift register region 1130. In other words, compared with FIG. 12, in the backward scan the left-bottom shift register (that is, the shift register SR(DB) in the shift register region 1120) is enabled first and then the shift registers in the shift register SR(DB) in the shift register region 1120.

Thus, according to the previously-described operation timing, the shift registers in the shift register regions 1130 and 1120 sequentially are alternately enabled. More specifically, the shift register SR(DB) in the shift register region 1120 is enabled first, and accordingly the output signal DummyL1 thereof is pulled up to a high voltage level; then, the shift register SR(DB) in the shift register region 1130 is enabled, and accordingly the output signal DummyR1 thereof is pulled up to a high voltage level; then, the shift register SR(2560) in the shift register region 1120 is enabled, and accordingly the output signal $S_{2560}$ thereof is pulled up to a high voltage level; . . . ; eventually, the shift register SR(DU) in the shift register region 1130 is enabled. Thus, through the aforementioned driving sequence, the gate lines G(2560), G(2559), . . . , G(1) are sequentially enabled from bottom to top thereby realizing the backward scan.

Figure 14:
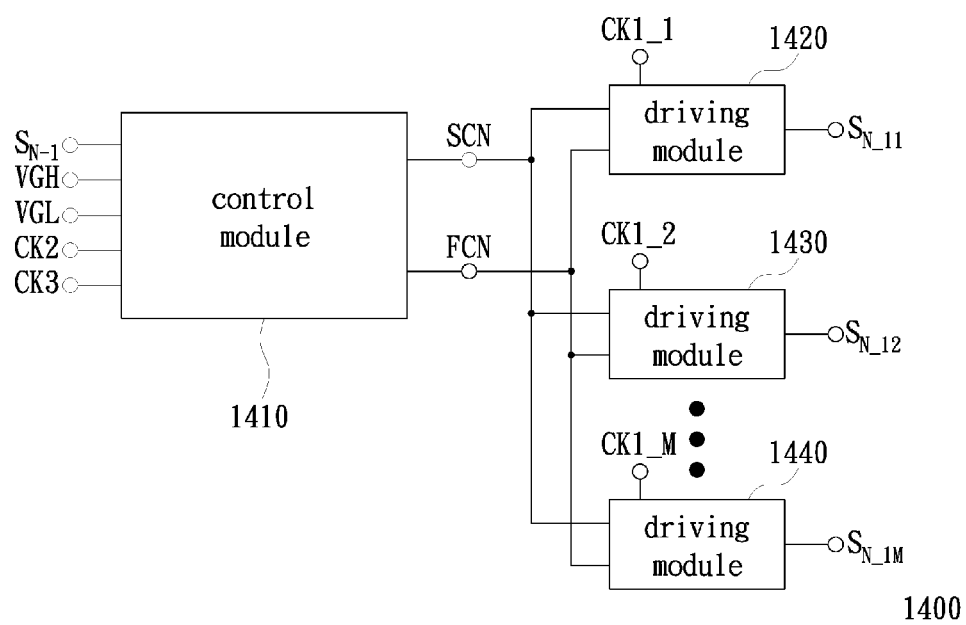
FIG. 14 is a circuit block view of a shift register in accordance with another embodiment of the present disclosure.

Additionally, in the shift register of the present disclosure, one control module may correspond to a plurality of driving modules. Referring to FIG. 14, which is a circuit block view of a shift register in accordance with another embodiment of the present disclosure. As shown, the shift register 1400 includes one control module 1400 and a plurality of driving modules 1420, 1430, . . . , 1440. Each one of the driving modules 1420, 1430, . . . , 1440 is electrically coupled to both of the driving control terminals FCN and SCN and is configured to receive the clock signals CK1_1, CK1_2, . . . , CK1_M and accordingly output the output signal $S_{N\_11}$, $S_{N\_12}$, . . . , $S_{N\_1M}$, respectively.

The control module 1410 and each one of the driving modules 1420, 1430, . . . , 1440 can be implemented with any previously-described embodiments and their modifications. Thus, the shift register 1400 can provide the clock signals CK1_1, CK1_2, . . . , CK1_M to the driving modules 1420, 1430, . . . , 1440, respectively, during the period between the pulses of the clock signals CK2 and CK3 (that is, the period of the pulse of the clock signal CK1 or the period between the time points $T_3$ and $T_4$, FIG. 10). In response to specific application requirements, the clock signals CK1_1, CK1_2, . . . , CK1_M may be completely non-overlapping, or partially overlapping, or completely overlapping if necessary. Thus, the shift register 1400 is more flexible in design and application.

In summary, the shift register provided by the embodiments of the present disclosure can increase the voltage level of the driving voltage level output terminal DN thereby strengthening the driving ability of the shift register. Because the voltage level of the driving voltage level output terminal DN is independent with the threshold voltage $V_{th}$, the driving ability of the shift register will not be affected even when a relatively large threshold voltage $V_{th}$ is generated by the manufacturing process drift. In other words, the shift register provided by the present disclosure has a greater threshold voltage manufacturing process drift tolerance range. And, through having an unique circuit design, the shift register provided by the present disclosure can also eliminate the period having the floating state at a specific node in prior art; and consequentially the shift register provided by the present disclosure has a greater leakage current tolerance range and is prevented from generating direct current. In addition, the shift register provided by the present disclosure is not needed to be implemented with resistors thereby having a reduced area size for the circuit layout.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register, configured to receive a previous-stage output signal, a start signal, a first clock signal, a second clock signal and a third clock signal, the shift register comprising:

a control module, comprising:
an input unit, comprising an activation terminal, the input unit being configured to determine whether to transmit the start signal to the activation terminal or not according to the previous-stage output signal;
a first control unit, comprising a first driving control terminal, the first control unit being electrically coupled to the activation terminal and configured to determine the first driving control terminal to receive a first operating voltage level or a second operating voltage level according to the voltage level of the activation terminal and the third clock signal; and
a second control unit, comprising a second driving control terminal, the second control unit being electrically coupled to the activation terminal and the first driving control terminal, the second control unit being configured to determine how to adjust the voltage level received by the activation terminal according to the voltage level of the first driving control terminal and the second clock signal and then provide the adjusted voltage level to the second driving control terminal; and a driving module, comprising:
an output terminal;
a driving voltage level determination unit, comprising a driving voltage level output terminal, the driving voltage level determination unit being electrically coupled to the first driving control terminal and the second driving control terminal, the driving voltage level determination unit being configured to determine whether to turn on an electrical channel between the driving voltage level output terminal and a specific node or not according to the voltage level of the first driving control terminal and determine whether to turn on an electrical channel between the driving voltage level output terminal and the second operating voltage level or not according to the voltage level of the second driving control terminal;
a first driving unit, electrically coupled to the first driving control terminal and the output terminal, the first driving unit being configured to determine whether to turn on an electrical channel between the output terminal and the first operating voltage level or not according to the voltage level of the first driving control terminal; and
a second driving unit, electrically coupled to the driving voltage level output terminal and the output terminal, the second driving unit being configured to determine whether to transmit the first clock signal to the output terminal or not according to the voltage level of the driving voltage level output terminal.

2. The shift register according to claim 1, wherein each one of the first driving control terminal and the second driving control terminal in one said control module is electrically coupled to a plurality of the driving modules.

3. The shift register according to claim 2, wherein the enable periods of the first clock signals of the driving modules do not overlay one another.

4. The shift register according to claim 1, wherein the first control unit comprises:
a first transistor, comprising a control terminal, a first channel terminal and a second channel terminal, the first transistor being configured to have the control terminal for receiving the third clock signal, the first channel terminal for receiving the second operating voltage level, and the second channel terminal electrically coupled to the first driving control terminal; and a second transistor, comprising a control terminal, a first channel terminal and a second channel terminal, the second transistor being configured to have the control terminal electrically coupled to the activation terminal, the first channel terminal electrically coupled to the first driving control terminal, and the second channel terminal electrically coupled to the third clock signal.

5. The shift register according to claim 4, wherein the first control unit further comprises:

a third transistor, comprising a control terminal, a first channel terminal and a second channel terminal, the third transistor being configured to have the control terminal for receiving a reset signal, the first channel terminal for receiving the second operating voltage level, and the second channel terminal electrically coupled to the first driving control terminal.

6. The shift register according to claim 1, wherein the second control unit comprises:

a first transistor, comprising a control terminal, a first channel terminal and a second channel terminal, the first transistor being configured to have the control terminal electrically coupled to the first driving control terminal, the first channel terminal electrically coupled to the activation terminal, and the second channel terminal electrically coupled to the first operating voltage level;

a second transistor, comprising a control terminal, a first channel terminal and a second channel terminal, the second transistor being configured to have the control terminal for receiving the second operating voltage level, the first channel terminal electrically coupled to the activation terminal, and the second channel terminal electrically coupled to the second driving control terminal;

a third transistor, comprising a control terminal, a first channel terminal and a second channel terminal, the third transistor being configured to have the control terminal electrically coupled to the second driving control terminal, and the first channel terminal electrically coupled to the second clock signal; and a fourth transistor, comprising a control terminal, a first channel terminal and a second channel terminal, the fourth transistor being configured to have the control terminal electrically coupled to the first driving control terminal, the first channel terminal electrically coupled to the second channel terminal of the third transistor, and the second channel terminal electrically coupled to the first operating voltage level.

7. The shift register according to claim 6, wherein the second control unit further comprises:

a fifth transistor, comprising a control terminal, a first channel terminal and a second channel terminal, the fifth transistor being configured to have both of the control terminal and the first channel terminal electrically coupled to the second channel terminal of the third transistor, and the second channel terminal electrically coupled to the activation terminal.

8. The shift register according to claim 1, wherein the driving voltage level determination unit comprises:

a first transistor, comprising a control terminal, a first channel terminal and a second channel terminal, the first transistor being configured to have the control terminal electrically coupled to the second driving control terminal, the first channel terminal for receiving the second operating voltage level, and the second channel terminal electrically coupled to the driving voltage level output terminal; and a second transistor, comprising a control terminal, a first channel terminal and a second channel terminal, the second transistor being configured to have the control terminal electrically coupled to the first driving control terminal, the first channel terminal electrically coupled to the driving voltage level output terminal, and the second channel terminal electrically coupled to the specific node, wherein the specific node is configured to receive the first operating voltage level.

9. The shift register according to claim 1, wherein the driving voltage level determination unit comprises:

a first transistor, comprising a control terminal, a first channel terminal and a second channel terminal, the first transistor being configured to have the control terminal electrically coupled to the second driving control terminal, the first channel terminal for receiving the second operating voltage level, and the second channel terminal electrically coupled to the driving voltage level output terminal; and a second transistor, comprising a control terminal, a first channel terminal and a second channel terminal, the second transistor being configured to have the control terminal electrically coupled to the first driving control terminal, the first channel terminal electrically coupled to the driving voltage level output terminal, and the second channel terminal electrically coupled to the specific node, wherein the specific node is electrically coupled to the output terminal.

10. The shift register according to claim 1, wherein the first driving unit comprises:

a first transistor, comprising a control terminal, a first channel terminal and a second channel terminal, the first transistor being configured to have the control terminal electrically coupled to the first driving control terminal, the first channel terminal electrically coupled to the output terminal, and the second channel for receiving the first operating voltage level.

11. The shift register according to claim 1, wherein the second driving unit comprises:

a first transistor, comprising a control terminal, a first channel terminal and a second channel terminal, the first transistor being configured to have the control terminal electrically coupled to the driving voltage level output terminal, the first channel terminal for receiving the first clock signal, and the second channel terminal electrically coupled to the output terminal.

12. The shift register according to claim 11, wherein the second driving unit further comprises:

a capacitive element, comprising a first terminal and a second terminal, the capacitive element being configured to have the first terminal electrically coupled to the driving voltage level output terminal, and the second terminal electrically coupled to the output terminal.

13. The shift register according to claim 1, further comprising:

a first transistor, comprising a control terminal, a first channel terminal and a second channel terminal, the first transistor being configured to have the control terminal electrically coupled to the output terminal, the first channel terminal electrically coupled to the first driving control terminal, and the second channel terminal for receiving the first operating voltage level.

14. A flat panel display using a plurality of shift registers, the shift register being configured to receive a previous-stage output signal, a start signal, a first clock signal, a second clock signal and a third clock signal, the shift register comprising a control module and a driving module, the control module comprising an input unit, a first control unit and a second control unit, the input unit comprising an activation terminal, the input unit being configured to determine whether to transmit the start signal to the activation terminal or not according to the previous-stage output signal, the first control unit comprising a first driving control terminal, the first control unit being electrically coupled to the activation terminal and configured to determine the first driving control terminal to receive a first operating voltage level or a second operating voltage level according to the voltage level of the activation terminal and the third clock signal, the second control unit comprising a second driving control terminal, the second control unit being electrically coupled to the activation terminal and the first driving control terminal, the second control unit being configured to determine how to adjust the voltage level received by the activation terminal according to the voltage level of the first driving control terminal and the second clock signal and then provide the adjusted voltage level to the second driving control terminal, the driving module comprising an output terminal, a driving voltage level determination unit, a first driving unit and a second driving unit, the driving voltage level determination unit comprising a driving voltage level output terminal, the driving voltage level determination unit being electrically coupled to the first driving control terminal and the second driving control terminal, the driving voltage level determination unit being configured to determine whether to turn on an electrical channel between the driving voltage level output terminal and a specific node or not according to the voltage level of the first driving control terminal and determine whether to turn on an electrical channel between the driving voltage level output terminal and the second operating voltage level or not according to the voltage level of the second driving control terminal, the first driving unit being electrically coupled to the first driving control terminal and the output terminal, the first driving unit being configured to determine whether to turn on an electrical channel between the output terminal and the first operating voltage level or not according to the voltage level of the first driving control terminal, the second driving unit being electrically coupled to the driving voltage level output terminal and the output terminal, the second driving unit being configured to determine whether to transmit the first clock signal to the output terminal or not according to the voltage level of the driving voltage level output terminal, the flat panel display comprising:
- a display region, crossed by a plurality of gate lines, each one of the plurality of gate lines being electrically coupled to at least a pixel circuit thereby determining whether to control the pixel circuit to receive a display data from a data line electrically coupled to the pixel circuit or not;
- a first shift register region, disposed between the display region and an edge of the flat panel display and located on a first side of the flat panel display, the first shift register region comprising a plurality of the shift registers connected in a cascade manner; and
- a second shift register region, disposed between the display region and the edge of the flat panel display and located on a second side of the flat panel display, the second shift register region comprising a plurality of the shift registers connected in a cascade manner,
- wherein the shift registers are sequentially and alternatively enabled by the first and second shift register regions, the first and second sides are two different sides of the flat panel display.

15. The flat panel display according to claim 14, wherein the first clock signal, the second clock signal and the third clock signal have a duty cycle 25%.

* * * * *